United States Patent [19]

Hajj Chehade et al.

[11] Patent Number: 4,535,296
[45] Date of Patent: Aug. 13, 1985

[54] FM-DEMODULATOR WITH LADDER FILTER DELAY LINE AND MULTIPLIER

[75] Inventors: Mohammed Hajj Chehade, Asnieres; Jean Lecat, Suresnes; Claude Tartois, Paris, all of France

[73] Assignee: U.S. Philips Corporation, New York, N.Y.

[21] Appl. No.: 397,254

[22] Filed: Jul. 12, 1982

[30] Foreign Application Priority Data

Jul. 24, 1981 [FR] France ................. 81 14453

[51] Int. Cl.³ .......................... H03D 3/02; H03K 9/06
[52] U.S. Cl. ................................ 329/103; 329/107; 329/137; 329/143; 329/145; 333/138; 455/214; 455/337
[58] Field of Search ............... 329/103, 107, 126, 139, 329/143, 145; 455/214, 337; 333/138

[56] References Cited

U.S. PATENT DOCUMENTS

| | | | |
|---|---|---|---|
| 2,229,640 | 1/1941 | Crosby | 455/214 X |
| 2,461,321 | 2/1949 | Guillemin | 333/138 X |
| 4,054,840 | 10/1977 | Sato | 329/103 |
| 4,431,970 | 2/1984 | Sumi et al. | 329/103 |

OTHER PUBLICATIONS

Zverev, *Handbook of Filter Synthesis*, Wiley & Sons, 1967, pp. 93-97.

*Primary Examiner*—Eugene R. LaRoche
*Assistant Examiner*—D. C. Mis
*Attorney, Agent, or Firm*—Thomas A. Briody; William J. Streeter; Edward W. Goodman

[57] ABSTRACT

For demodulating an FM-carrier which is, for example, modulated by a video signal and two sound subcarriers, a Gilbert mulitplier (13) and a phase shifting circuit (12) are used. The phase shifting circuit is formed by elements of a Gaussian type bandpass-ladder filter consisting of at least three sections each representing one pole. The output (10) of the phase shifting circuit is taken from the output of a filter section prior to the last filter section.

5 Claims, 6 Drawing Figures

FM-DEMODULATOR WITH LADDER FILTER DELAY LINE AND MULTIPLIER

The invention relates to an FM-demodulator, comprising a multiplier circuit and a phase shifting circuit, an input of the multiplier circuit being connected to an input of the phase shifting network, a further input of the multiplier circuit being connected to an output of the phase shifting circuit.

FM-signals are often used for transmitting sound or picture signals in radio and television broadcasting systems. In television broadcasting, a special problem is encountered, as the transmission frequency range is wider than in radio broadcasting. Particularly in satellite television systems, use is made of a picture carrier whose frequency is modulated by a television signal, which television signal may comprise two sound subcarriers whose frequencies deviate by 5.5 and 5.75 MHz from the frequency of the picture carrier. Such a frequency-modulated television signal covers an effective bandwidth of 27 MHz. The intermediate frequency chosen is 134 MHz, the relative IF bandwidth is 27:134, that is to say 20 % (while in radio broadcasting it is approximately 200 kHz at 10.7 MHz, so hardly 2%). When the linearity of the demodulation is insufficient, intermodulation products occur, more specifically between the two sound subcarriers at 5.5 and 5.75 MHz. This causes a line disturbance at 250 kHz in the spectrum of the demodulated video signal. Further parasitic line disturbances may be caused by interference between the two sound subcarriers and the chrominance subcarrier of the video signal, a very annoying moiré then occurring in the picture. In order to obtain a satisfactory picture quality, it is necessary that in a relative IF bandwidth of, for example, 16 % the non-linearity is less than 0.4%.

In the known frequency demodulator, the actual intermediate frequency signal is multiplied by the phase shifted intermediate frequency signal which has passed through a phase shifting circuit. Such a prior art FM-demodulator is described in, for example, the publication "Le récepteur à modulation de fréquence" by Jean CERF, in the CHIRON-publications, pages 125 ... 127.

For very narrow IF bandwidths, a phase shifting circuit, being formed by two coupled resonant circuits, optionally with an auxiliary circuit tuned to the central frequency, shows an acceptable linearity. For wide IF bandwidths, the resonant circuits must be damped, as a result of which the sensitivity of the demodulator decreases. It is then however hardly possible to accomplish the desired linearity within a relative bandwidth of more than 5%. So circuits of this type have very poor results when they are used, as mentioned above, in television systems.

SUMMARY OF THE INVENTION

The invention has for its object to provide a FM-demodulator which has a very good linearity in a wide bandwidth.

In addition, the invention has for its object to increase the sensitivity of such a demodulator.

According to the invention, a FM-demodulator of the type described in the opening paragraph is characterized in that the phase shifting circuit comprises at least one section from a plurality of cells of a bandpass ladder filter and at most, a number of sections which is less than the total number of sections of said bandpass-filter, and that the output of this phase shifting circuit is directly connected to an input of the multiplier circuit.

The invention is based on the recognition that certain types of ladder filters which have a short and constant group delay time can be used in such a demodulation circuit not in their function as filters, but in their effect as phase shifting circuits. The signal reflections via the unutilized section or sections can be used to obtain an improvement in the linearity of the phase shift variation within the passband.

By means of the measure in accordance with the invention, an excellent linearity of the demodulation in a considerable passband can be obtained.

Advantageously, a bandpass-ladder filter of the Gaussian filter class is used. This type is defined as being a filter type whose impulse response does not exhibit considerable sudden transitions ripple and is symmetrical relative to the instant at which the reproduction is optimum. For a filter having desired properties as regards the impulse response, the phase characteristic must be linear, so that in the FM-demodulator in accordance with the invention, an excellent linearity is obtained, of course on the condition that the multiplier is also linear.

In addition, the demodulated signal coming from the multiplier depends on the integral, i.e. the area difference between the positive and the negative excursions and the zero level of a substantially square-wave signal. If ripple occurs the area between the zero level and the positive excursion is not equal to the area between the zero level and the negative excursion, as this ripple is not of the same magnitude for both polarities. This ripple consequently causes the occurrence of area differences, which has a negative effect on the linearity of the demodulation. In accordance with a particularly interesting improvement, a Gaussian bandpass-filter of the type having a uniform waveform in the group delay time is used. This has the advantage that a much wider passband can be realized with the same number of filter sections. A frequency-dependent phase variation then occurs within the passband and a quasi-linear FM-demodulation is obtained.

A special embodiment comprises four ladder sections, and the output of the phase-shifted signal is provided after the first section. This embodiment results in a good and easily adjustable linearity.

In another preferred embodiment, a section of the filter comprises, in a ladder configuration, two parallel capacitors which are mutually interconnected via a parallel LC-circuit. If proper values are chosen for the componens, this simple configuration has the desired phase shift curve.

DESCRIPTION OF THE DRAWINGS

The invention will now be further described by way of non-limitative example with reference to the accompanying drawings. Herein.

DESCRIPTION OF THE PREFERRED EMBODIMENT

Figure 1:
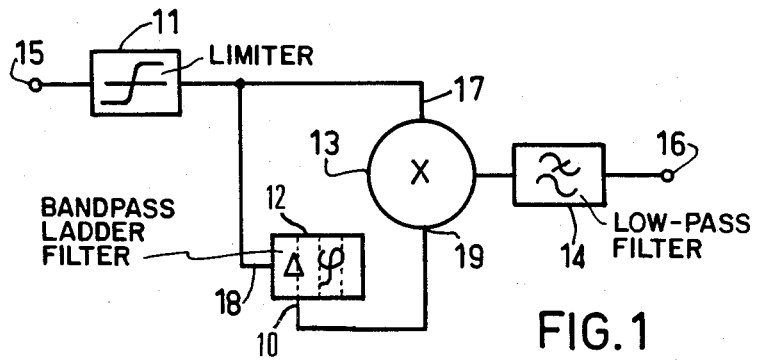
FIG. 1 shows a block diagram of an FM-demodulator in accordance with the invention.

As shown in FIG. 1, a FM-demodulator in accordance with the invention comprises a phase shifting multiplier circuit 13 and a circuit 12 which functions as a bandpass-ladder filter. An input 17 of the multiplier circuit 13 is connected to an input 18 of the phase shifting circuit 12 and a further input 19 of the multiplier circuit 13 is connected to an output 10 of the same phase shifting circuit 12.

The demodulation of an FM-signal applied to a terminal 15 is obtained by limiting the amplitude of this signal in a limiter 11, conveying this limited signal through the phase shifting circuit 12 and by multiplying this limited signal, on the input 18, with the signal on the output 10 of the phase shifting circuit 12 by means of the multiplier circuit 13. The output signal of the multiplier circuit 13 is therafter filtered in a low-pass filter 14 and is available on the terminal 16. The limiter 11 and the filter 14 are known to a person skilled in the art.

Figure 2:
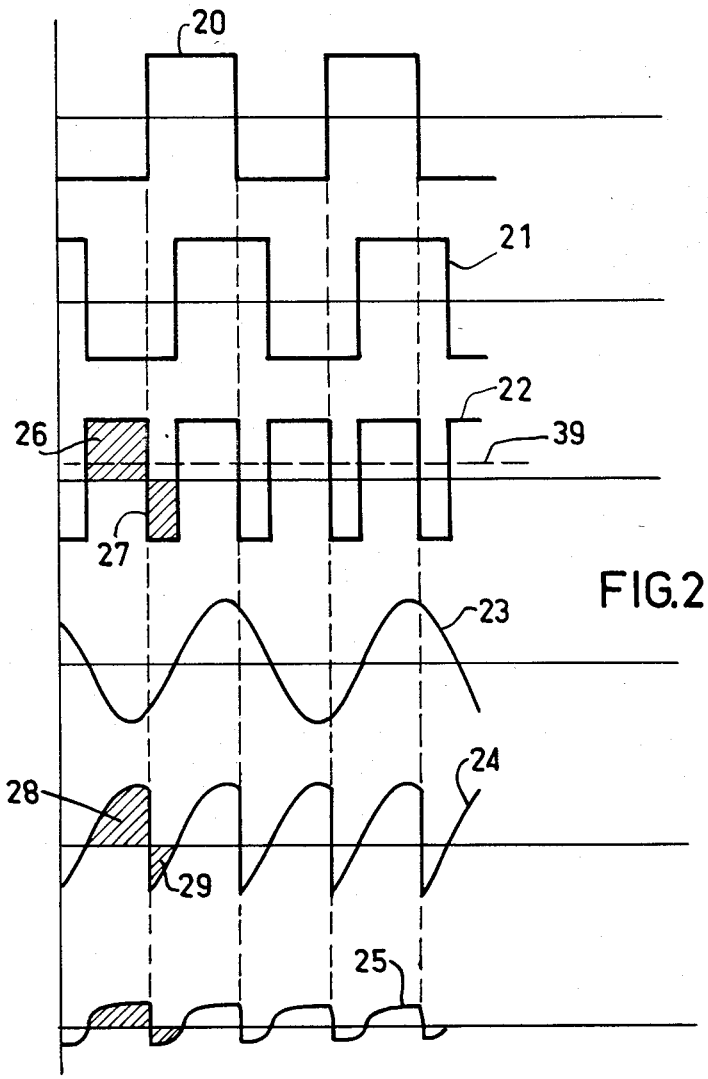
FIG. 2 shows the time-dependent variation of a number of signals which occur in the FM-demodulator of FIG. 1 the demodulation procedure.

FIG. 2 shows the operation of the multiplier circuit 13. The reference signals 21 or 23 may be present at the output 10 of the phase shifting circuit 12 and the reference signal 20 at the input 17 of the multiplier circuit 13 and the input 18 of the phase shifting circuit 12. The multiplier circuit 13 operates as a change-over switch controlled by the signal 20: in accordance with the polarity of this signal 20, the signal 21 is inverted or not inverted. So the signal 22 is present on the output of this multiplier circuit 13.

When it passes through a low-pass filter 14 (FIG. 1), which operates as an integrator, the signal 22 is converted into a direct current signal 39, whose amplitude is proportional to the difference between the hatched areas 26 and 27. When the signal 22 is adequately limited, these areas are proportional to the pulse width of the square wave and the amplitude of the signal 39 varies linearly versus the phase shift between the signals 20 and 21 for values of the phase shift between 0 and $\pi$ radian. With a phase shift which depends linearly on the frequency of the signal, a linear frequency demodulation is possible. This linear frequency demodulation is not possible with the phase shift effected by the coupled resonant circuits in accordance with the prior art. There are, however, bandpass-ladder filters which are usually employed for processing radar pulses, whose group delay time is constant in a given frequency range, in order to prevent the pulses from being distorted. A constant group delay time implies a phase shift which varies linearly versus the frequency.

By means of such a bandpass-ladder filter, the harmonics of the frequencies to be demodulated are attenuated, or quasi-suppressed, and the accurately square-wave signal at the output of the limiter 11 appears in an almost sinusoidal shape at the output of such a filter, as shown at 23. When the output signal from the last-mentioned filter is mutiplied in an optimum manner by the reference signal 20, the signal produced by the multiplier circuit 13 will have the shape shown at 24. The signal integrated by the low-pass filter 14 will then be proportional to the difference between the hatched areas 28 and 29 and will therefore vary sinusoidally versus the phase shift with a value zero for a phase shift of $\pi/2$ radians and with the minimum and maximum values for a phase shift of 0 and $\pi$ radians, respectively. In practice, the multiplier circuit 13 has saturation thresholds and the signal then produced actually has the form shown at 25 rather than the form shown at 24. As a result thereof, the variation of the phase shift-dependent output voltage of the multiplier circuit 13 is equal to the variation 22 and 25, respectively, caused by the signals 21 and 23 and is very close to the variation 24 caused by the signal 23. So a linear variaton is obtained which is distorted to a very small extent by a sinusoidal variaton.

Figure 3:
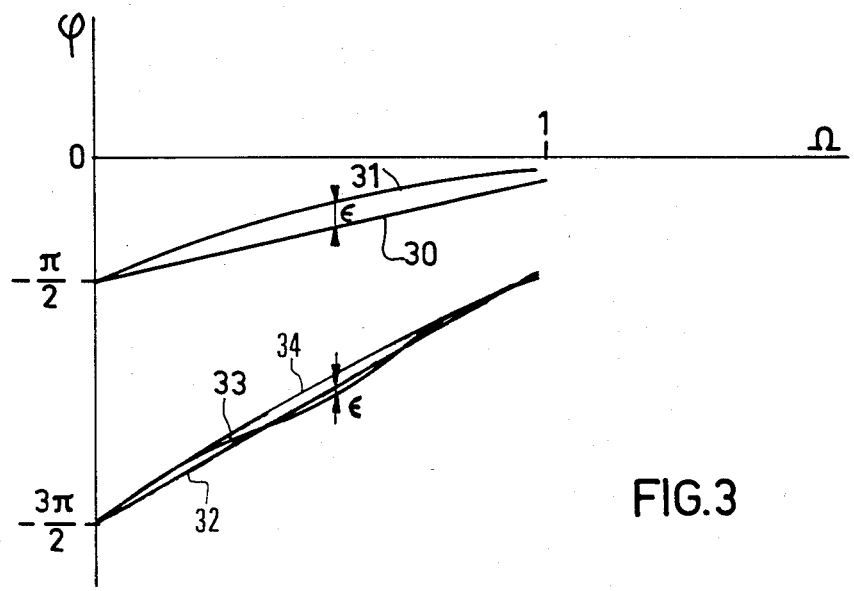
FIG.3 shows the relationship between the frequency and the phase shift effected by a filter of the Gaussian type.

FIG. 3 shows phase-frequency curves of a band-pass ladder filter of the Gaussian type. The parameter $\Omega$ is plotted on the horizontal axis, $\Omega$ being defined by:

$$\Omega = \frac{\frac{w}{w_0} - \frac{w_0}{w}}{\frac{w_{B2}}{w_0} - \frac{w_{B1}}{w_0}}$$

Herein, $w = 2\pi f$, f being the pulse frequency of the signal to be processed, $w_{B1}$ and $w_{B2}$ indicate $2\pi$ times the pulse frequencies at both limits of the 3 dB-passband, at which limits the signal attenuation amounts to 3 dB and $w_0$ is the geometrical mean of $w_{B1}$ and $w_{B2}$ ($w_0 = \sqrt{w_{B1} \cdot w_{B2}}$). So this standardized parameter $\Omega$ is zero for $w = w_0$, 1 for $w = w_{B2}$ and $-1$ for $w = w_{B1}$. Since the curve around the $\Omega = 0$ is symmetrical only the right-hand half is shown. The curve 30 represents an ideal, accurate, linear variation at the section which represents a pole. But in theory, a bandpass-ladder filter can only be a Gaussian filter at an infinite number of sections: the curve 31 shows the real phase variation for a filter having one section. The curving thereof is in a proper direction in order to compensate for the sinusoidal components produced by the multiplier circuit 13, but the deviation $\epsilon$ with respect to the curve 30 is too large.

The curves 32 and 33 show the same variation, now however for a bandpass-ladder filter having three sections. The curve 32 represents an ideal variation and the curve 33 shows the actual variation in the special case in which an above-mentioned bandpass-ladder filter having a uniform waveform in the group delay time is used. Compared with the ideal curve 32, the curve 33 shows a deviation $\epsilon$, which changes polarity. The curve 33 approaches the desired curve 32 closer than the curve 31. The phase variation for a bandpass-ladder filter having a constant group delay time ("maximally flat group delay") or BESSEL-filter is shown by means of curve 34. the deviation $\epsilon$ of this curve 34 with respect to the ideal curve 32 exhibits no change or polarity. The effective passband is, however, not so wide as the passband of the filter whose phase varies in accordance with curve 33 (this is not apparent from the Figure owing to the standardized unit $\Omega$). These curves can be derived from the standardized group delay curves shown on page 93 and 95 of the publication "Handbook of filter synthesis" by Zverev, published by WILEY & SONS in 1967.

As mentioned above, an accurately linear phase variation can only be obtained if a large number of filter sections is used. The sinusoidal distortion of the output signal of multiplier circuit 13 can be prevented from occurring by supplying a square-wave signal to the input of the multiplier circuit 13, that is to say by arranging a limiter-amplifier between the phase shifting circuit 12 and the multiplier circuit 13. So the problem can be solved by means of a bandpass-ladder filter having a large number of sections and by providing an optimum limiter-amplifier. Such a solution is however very complicated. In addition, it has been found that a frequency-dependent phase variation resulting in a very good correction without the use of a limiter-amplifier is achieved by tapping off the signal after the first section of a filter formed by three or four sections. Then a phase variation having the form of an intermediate curve between the curves 30 and 31 is obtained. The use of four, instead of three, sections results in a more accurate phase-variation adjustment. When four sections are used, it is also possible to tap off the signal behind the third section and to obtain satisfactory results.

So for a phase shifting circuit, use is made of at least one section from a plurality of sections of a bandpass-ladder filter, and the output of this bandpass-ladder filter, operating as a phase shifting circuit, is directly connected to the multiplier circuit. "Directly connected" is here understood to mean that no limiter-amplifier is provided between these two elements. A phase-shifting circuit of a frequency demodulator is thus formed by at least one section from a plurality of sections of a bandpass-ladder filter, the connection between the output of this phase shifting circuit and the input of a multiplier circuit being direct. Said bandpass-ladder filter is of the Gaussian type, possibly having a uniform wave-form in the group delay-time, resulting in a large passband in which the phase shift is approximately linear. Such a bandpass-ladder filter causes a very low degree of distortion, which compensates for the distortion of the multiplier circuit.

Figure 4:
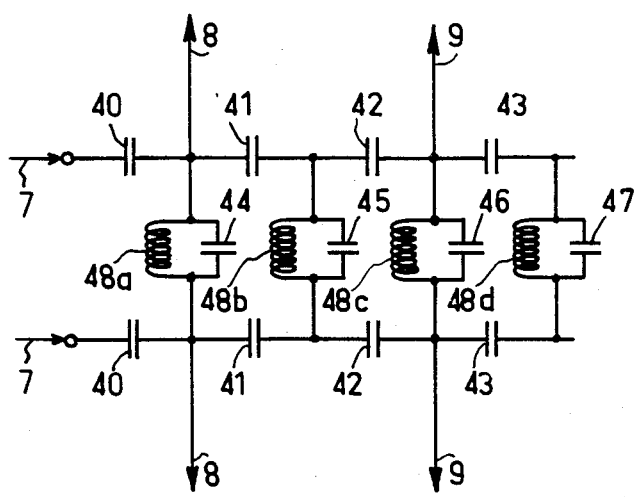
FIG. 4 shows a circuit diagram of a bandpass-ladder filter for use in an FM-demodulator in accordance with the invention.

FIG. 4 shows the structure of such a bandpass-ladder filter. This filter comprises four sections and the phase-shifted output signal is present on the terminals 8 behind the first section formed by the components 40, 44 and 48a. The signal on the terminals 9 behind the first three sections may alternatively be used as the output signal. Which signal is used depends on the signal form on the output of the limiter 11 and on the behavior of the multiplier circuit 13.

Each section is formed by two parallel circuits of series-arranged capacitors 40, 41, 42 and 43, and parallel LC-circuits, respectively formed by inductances 48a 48b, 48c and 48d and capacitors 44, 45, 46, 47, these parallel circuits being connected in shunt between the respective pairs of capacitors, respectively. The number of sections from which the phase shifting circuit is formed, i.e. one or three sections, is less than the total number of sections of the filter (four sections). If the signals are taken off at 8, the components 43, 48d and 47 may be omitted, that is to say the fourth section. In the above-mentioned publication by Zverev, page 97 shows a Table with values from which the elements of the filter can be calculated. In this calculation a phase error of 0.5° is opted for and a no-load overvoltage of 70 for the inductances. Good results are obtained when the following values are chosen for the elements:

inductance 48: controllable around 200 nH
capacitor 40: 2.7 pF
capacitor 41: 6.8 pF
capacitor 42: 3.9 pF
capacitor 43: 2.7 pF
capacitor 44: 3.3 pF
capacitor 45: 2.2 pF
capacitor 46: 3.3 pF
capacitor 47: 4.7 pF
damping resistors: 1.5 kOhm.

In the event in which the output signal is taken from the terminals 9, that is to say behind the third section, the values of the damping resistors must be increased and the magnitude of the inductances must be changed, in order to increase the passband.

Instead of connecting the shunt element of the phase shifting circuit to ground, preference is given to a symmetrical structure, which makes it possible to make a connection to active differential symmetrical circuits. The multiplier circuit used is of the type which is commonly referred to as a "Gilbert multiplier". Such a circuit and its use as a phase detector are described in the publication "Analysis & Design of Analog Integrated Circuits" by GRAY and MEYER, published in 1977 by WILEY & SONS, pages 563-566 and 570-575.

Figure 5:
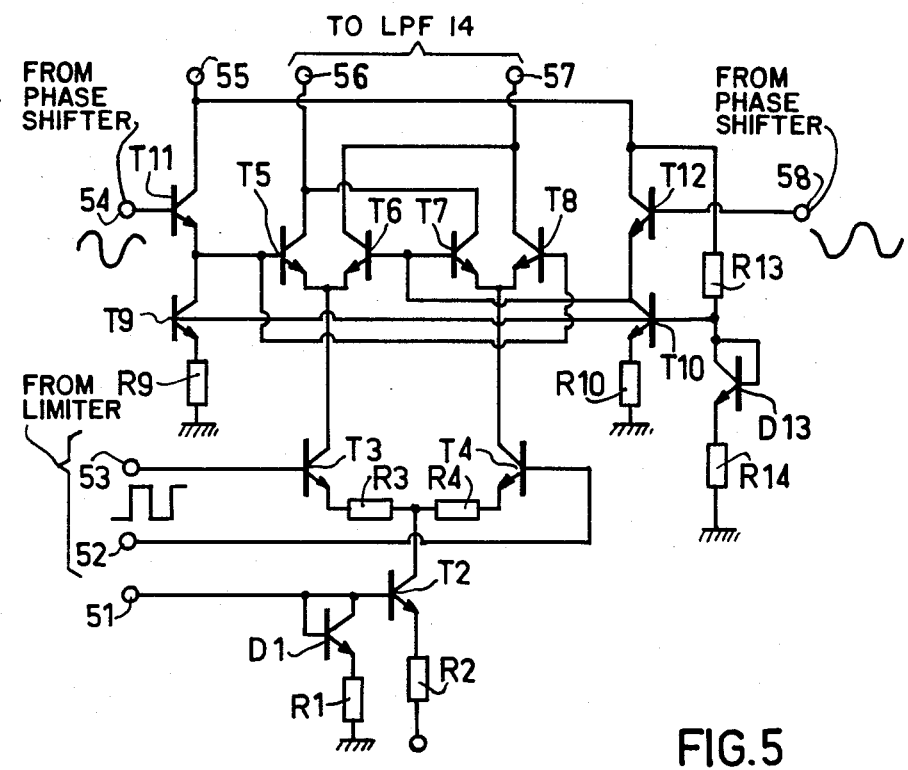
FIG. 5 shows a circuit diagram of a multiplier circuit for use in an FM-demodulator in accordance with the invention.

FIG. 5 shows a special embodiment. The elements forming the Gilbert multiplier are the transistors T3-T4, T5-T6 and T7-T8, arranged in differential pairs. The combinations T9-R9 and T10-R10 form current sources controlled by the resistance network R13-R14 connected to the terminal 55 for the supply voltage. Diode D 13 is used for temperature stabilization. The transistors T11 and T12 in emitter follower configuration are fed from the current sources T9 and T10 and exhibit a high input impedance for the differential input terminals 54 and 58 to which the signals coming from the symmetrical terminals 8 (or 9) in FIG. 4 are applied. The symmetrical signals received from the limiter 11 in FIG. 1 are applied to the terminals, 52 and 53 and also to the input terminals 7 in FIG. 4. The resistors R3 and R4 are included in the emitter leads of T3 and T4. The combination R1-R2-T2-D1 forms a temperature-stabilized current source, if the terminal 51 is connected to a reference voltage source. The values of the resistors are:

R9, R10 : 100 ohms
R13: 11,000 ohms
R14: 200 ohms
R3, R4: 50 ohms
R1, R2: 150 ohms.

The embodiment shown can be produced in an advantageous manner in integrated circuit technique, for example in the technique denoted "subilo" technique of "R.T.C. LA RADIOTECHNIQUE-COMPELEC", the emitters of the transistors having uniform dimensions of 3 μm.

Figure 6:
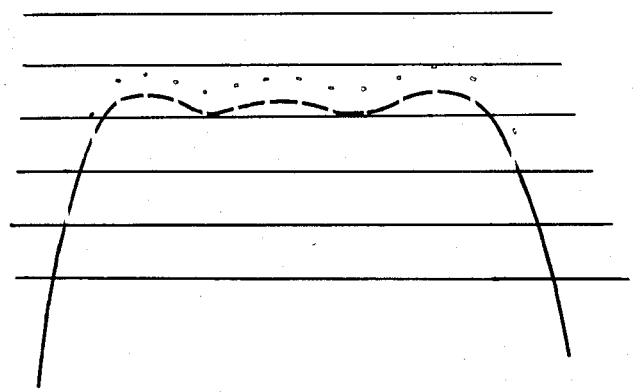
FIG. 6 is a graph showing the results obtained by means of an FM-demodulator in accordance with the invention.

FIG. 6 shows the results obtained. The linearity deviations are plotted on the vertical axis and the frequency is plotted on the horizontal axis. The intervals between each of the horizontal lines represent a linearity deviation of 1% and the lines into which the curve is divided are interspaced by 2 MHz. The zone in which the waveform of the curve does not exceed 0.4% is approximately 24 MHz, that is to say 18 % of the relative passband. So the object aimed at is achieved. A satisfactory adjustment of this waveform is obtained by adjusting the cores of the inductances alternately and in the sequence: 48a, 48d, 48a (again), 48b, 48c. The correct adjustment is obtained very easily. Other alternative embodiments are possible and particularly as regards the bandpass-ladder filter several different structures are conceivable with the desired phase characteristic without departing from the scope of the invention.

What is claimed is:

1. An FM-demodulator comprising a multiplier circuit and a phase shifting circuit, an input of the multiplier circuit being electrically connected to an input of the phase shifting network, a further input of the multiplier circuit being directly electrically connected to an output of the phase shifting circuit, characterized in that the phase shifting circuit comprises at least one section from a plurality of sections of a bandpass-ladder filter having a short and constant group time delay and at most a number of sections which is less than the total number of sections of said bandpass filter, whereby signal reflections via the unused section or sections of said bandpass filter are used to obtain an improvement in the linearity of the phase shift variation within the passband.

2. An FM-demodulator as claimed claim 1, characterized in that the bandpass-ladder filter is of the Gaussian filter type.

3. An FM-demodulator as claimed in claim 2, characterized in that the bandpass-ladder filter is of the type having a uniform waveform in the group delay time.

4. An FM-demodulator as claimed in claim 1, characterized in that the bandpass-ladder filter comprises four ladder sections, and that the output of the phase shifted signal is located behind the first section.

5. An FM-demodulator as claimed in any of the preceding claims, characterized in that the bandpass-ladder filter comprises two parallel circuits of series arranged capacitors, and respective LC-networks which interconnect the parallel circuits at the junction points between respective capacitors in the respective parallel circuits.

* * * * *